(12) United States Patent
Rub

(10) Patent No.: US 8,782,505 B2
(45) Date of Patent: Jul. 15, 2014

(54) METHODS AND DEVICES TO REDUCE OUTER CODE FAILURE RATE VARIABILITY

(71) Applicant: Seagate Technology LLC, Cupertino, CA (US)

(72) Inventor: Bernardo Rub, Sudbury, MA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 13/933,911

(22) Filed: Jul. 2, 2013

(65) Prior Publication Data

US 2013/0297979 A1 Nov. 7, 2013

Related U.S. Application Data

(63) Continuation of application No. 12/790,126, filed on May 28, 2010, now Pat. No. 8,489,979.

(51) Int. Cl.
*G06F 11/00* (2006.01)

(52) U.S. Cl.
USPC ............................ 714/810; 714/756; 714/773

(58) Field of Classification Search
USPC .................................. 714/810, 756, 773, 762
See application file for complete search history.

(56) References Cited

U.S. PATENT DOCUMENTS

| | | | |
|---|---|---|---|
| 7,673,229 B1 | 3/2010 | Pearson et al. | |
| 7,739,576 B2 | 6/2010 | Radke | |
| 8,055,979 B2 | 11/2011 | Wu et al. | |
| 8,127,199 B2 * | 2/2012 | Andersson | 714/762 |
| 2011/0296272 A1 | 12/2011 | Rub | |

FOREIGN PATENT DOCUMENTS

| | | |
|---|---|---|
| WO | WO 2008/086237 | 7/2008 |
| WO | WO 2009/053961 | 4/2009 |
| WO | WO 2009/078006 | 6/2009 |

OTHER PUBLICATIONS

File History for U.S. Appl. No. 12/790,126 as retrieved from the U.S. Patent and Trademark Office.

\* cited by examiner

*Primary Examiner* — Fritz Alphonse
(74) *Attorney, Agent, or Firm* — Hollingsworth Davis, LLC

(57) ABSTRACT

The variability of outer code failure rate of memory pages of a solid state memory device can be reduced by selectively grouping the pages included in the outer code words. The data in the page groups are encoded into outer code words which are stored in the memory device. Encoding the data of the page groups and storing the encoded data includes intermittently accumulating an outer code parity as the pages are sequentially stored in the memory device according to a particular order. The pages can be randomly selected for the page groups or can be grouped based on predicted or measured failure rate information. In a memory device having multi-level memory cells, predicting the failure rate of a page can be based on whether the page is a most significant bit (MSB) page or a least significant bit (LSB) page.

20 Claims, 12 Drawing Sheets

*Figure 6*

| | | | | | | |
|---|---|---|---|---|---|---|
| \multicolumn{5}{l}{Outer code 0 (outer code for page group 751)} | | |
| Outer code word 0 | Outer code word 1 | Outer code word 2 | ... | | | |
| $b0_0$ | $b1_0$ | $b2_0$ | ••• | 770 | Inner Parity | Die 0 |
| $b0_1$ | $b1_1$ | $b2_1$ | ••• | 771 | Inner Parity | Die 1 |
| $b0_2$ | $b1_2$ | $b2_2$ | ••• | 772 | Inner Parity | Die 2 |
| $b0_3$ | $b1_3$ | $b2_3$ | ••• | 773 | Inner Parity | Die 3 |
| $b0_4$ | $b1_4$ | $b2_4$ | ••• | 774 | Inner Parity | Die 4 |
| $b0_5$ | $b1_5$ | $b2_5$ | ••• | 775 | Inner Parity | Die 5 |
| $b0_6$ | $b1_6$ | $b2_6$ | ••• | 776 | Inner Parity | Die 6 |
| $b0_7$ | $b1_7$ | $b2_7$ | ••• | 777 | Inner Parity | Die 7 |
| $b0_8$ | $b1_8$ | $b2_8$ | ••• | 778 | Inner Parity | Die 8 |
| $b0_9$ | $b1_9$ | $b2_9$ | ••• | 779 | Inner Parity | Die 9 |
| $b0_{10}$ | $b1_{10}$ | $b2_{10}$ | ••• | 780 | Inner Parity | Die 10 |
| $b0_{11}$ | $b1_{11}$ | $b2_{11}$ | ••• | 781 | Inner Parity | Die 11 |
| $b0_{12}$ | $b1_{12}$ | $b2_{12}$ | ••• | 782 | Inner Parity | Die 12 |
| $b0_{13}$ | $b1_{13}$ | $b2_{13}$ | ••• | 783 | Inner Parity | Die 13 |
| $b0_{14}$ | $b1_{14}$ | $b2_{14}$ | ••• | 784 | Inner Parity | Die 14 |
| OP0 | OP1 | OP2 | ••• | 741 | Inner Parity | Die 15 |

*Figure 7B*

METHODS AND DEVICES TO REDUCE OUTER CODE FAILURE RATE VARIABILITY

RELATED APPLICATIONS

This application is a continuation of U.S. patent application Ser. No. 12/790,126, filed on May 28, 2010, now U.S. Pat. No. 8,489,979, which is hereby incorporated herein by reference in its entirety.

SUMMARY

Various embodiments of the invention are generally directed to providing outer code protection for solid state memory devices.

According to a method of encoding and storing data in a solid state memory device, data is encoded into inner code words corresponding to pages of the memory device that are sequentially accessed in a particular order. Pages are selected for page groups that reduce failure rate variability of outer codes of the page groups. Each outer code includes data information and outer code parity information. The page groups are encoded into the outer codes and the encoded pages are stored in the memory device. Encoding page groups and storing the encoded page groups includes intermittently accumulating the outer code parity for each of the page groups as the pages are sequentially stored in the memory device according to the particular order. The failure rates of the first pages selected for a page group and second pages selected for the page group may have different failure rates.

In some implementations, the pages may be randomly selected for the page groups. In some implementations, the failure rates of the pages may be determined or predicted and the page groups selected based on the determined or predicted failure rates. For example, predicting the failure rates of the pages involves predicting according to whether the page is a most significant bit (MSB) page or a least significant bit (LSB) page.

The page groups may be stored by interleaving pages of first page group encoded using a first outer code with pages of a second page group encoded using a second outer code.

For example, interleaving the pages of the first and second page groups can be accomplished by storing first pages encoded by a first outer code and accumulating first outer code parity information. After storing the first pages encoded by the first outer code, storing first pages encoded by a second outer code and accumulating second outer code parity information. After storing the first pages encoded by the second outer code, storing second pages encoded by the first outer code and continuing to accumulate the first outer code parity information. After storing the second pages encoded by the first outer code, storing the first outer code parity information.

A solid state non-volatile memory device may use multi-level memory cells configured to store more multiple bits of data According to a method of operating a solid state memory device using multi-level memory cells data is encoded into inner code words, arranged according to most significant bit (MSB) pages and least significant bit (LSB) pages which are sequentially accessed in a particular order. The page groups of MSB pages and LSB pages are encoded into outer codes so that each page group has a substantially equal number of MSB pages and LSB pages. The encoded page groups are stored in the memory device. Encoding the page groups and storing the encoded page groups includes intermittently accumulating the outer code parity for each of the page groups as the pages are sequentially stored in the memory device according to the particular order.

Encoding the MSB and LSB pages into the outer codes can involve encoding paired MSB and LSB pages into the outer code words. Each of the paired MSB and LSB pages are stored together in the same physical page of the memory cells.

Some embodiments of the invention involve a non-volatile memory device. An inner encoder encodes data into inner code words arranged according to pages of the memory device, where the pages are associated with failure rate information. Page grouping circuitry groups the pages into groups that reduce the variability of the outer code failure of the page groups. An outer encoder encodes the pages of page groups into outer codes. The outer encoder includes a parity generator that intermittently accumulates the outer code parity for each of the page groups as the pages are sequentially stored in the memory device according to the particular order. Modulator circuitry stores the encoded pages in memory cells of the memory device.

The memory device may additionally include demodulator circuitry configured to read the encoded pages stored in the memory cells and a decoder configured to correct errors in the pages read from the memory cells using the outer code words.

The page grouping circuitry may randomly select the pages for a page group; may select the pages for a page group according to failure rates of the pages, or may select the pages for a page group according to the distributions of the sensed voltages on the memory cells. In some implementations, the page grouping circuitry may select for each page group at least some first pages having a failure rate below a threshold and at least some second pages having a failure rate above a threshold for each page group.

The page grouping circuitry may dynamically group the pages for each of a plurality of write cycles. For example, the page grouping circuitry may re-group pages for a plurality of sequential write cycles.

In come implementations, each of the page groups includes a substantially equal number of most significant bit (MSB) pages and least significant bit (LSB) pages. The MSB and LSB pages can be stored together in a physical page of the memory cells.

These and other features and aspects which characterize various embodiments of the present invention can be understood in view of the following detailed discussion and the accompanying drawings.

BRIEF DESCRIPTION OF THE DRAWINGS

FIG. 6 illustrates a portion of a multi-level solid state non-volatile memory device;

FIG. 7B depicts an outer code arrangement showing the multiple outer words that cover a page group;

DETAILED DESCRIPTION

Error correction in solid state devices becomes more important as the technology moves to smaller dimensions and to memory cells capable of storing multiple bits. Outer codes may be used in solid state memory devices for bad die recovery and to improve the unrecoverable error rate (UER). The UER is dependent on the failure rate of the inner and outer codes.

Solid state memory devices may include one or more memory chips and each memory chip may include one or more memory die. Each memory die includes memory cells arranged in physical pages of individual memory cells. Each physical page may be arranged in one or more logical pages. For example, multi-level solid state non-volatile (NVM) devices may be implemented with two or more logical pages corresponding to a single physical page as described in more detail below.

The logical pages, e.g., MSB and LSB pages, can have significantly different bit error rates resulting in the MSB and LSB pages having different UERs. It is desirable reduce the variability of the UERs of the logical pages to reduce the overall error rate of the memory device. One approach to reduce the variability of the UERs of paired logical pages in a multi-level memory device is to shift the detection thresholds used to determine the logical state of the memory cells. Although effective at one signal to noise ratio (SNR) value, this approach may not reduce the variability in both the retry rate, which reflects the probability of inner code failure, and the UER, which reflects the probability of outer code failure.

In the approaches described herein, pages (or other data elements) are selectively grouped into page groups that are encoded by the outer code words, wherein the selective grouping reduces the variability of outer code failure and improves the overall UER of the memory device. Each of the pages of the memory device may have a historical failure rate which, in various embodiments, may be unknown, or may be known (because the historical failure rate for each page has been determined), and/or may be predicted from measured data and/or inherent characteristics of the pages. The selective grouping may be a randomized grouping of the pages, or may be based on the measured and/or predicted page failure rates. The selective grouping may be statically determined, e.g., the same page groupings are used for each write cycle. Alternatively, the selective grouping may be dynamic, wherein the pages are regrouped from one write cycle to another write cycle.

Figure 1:
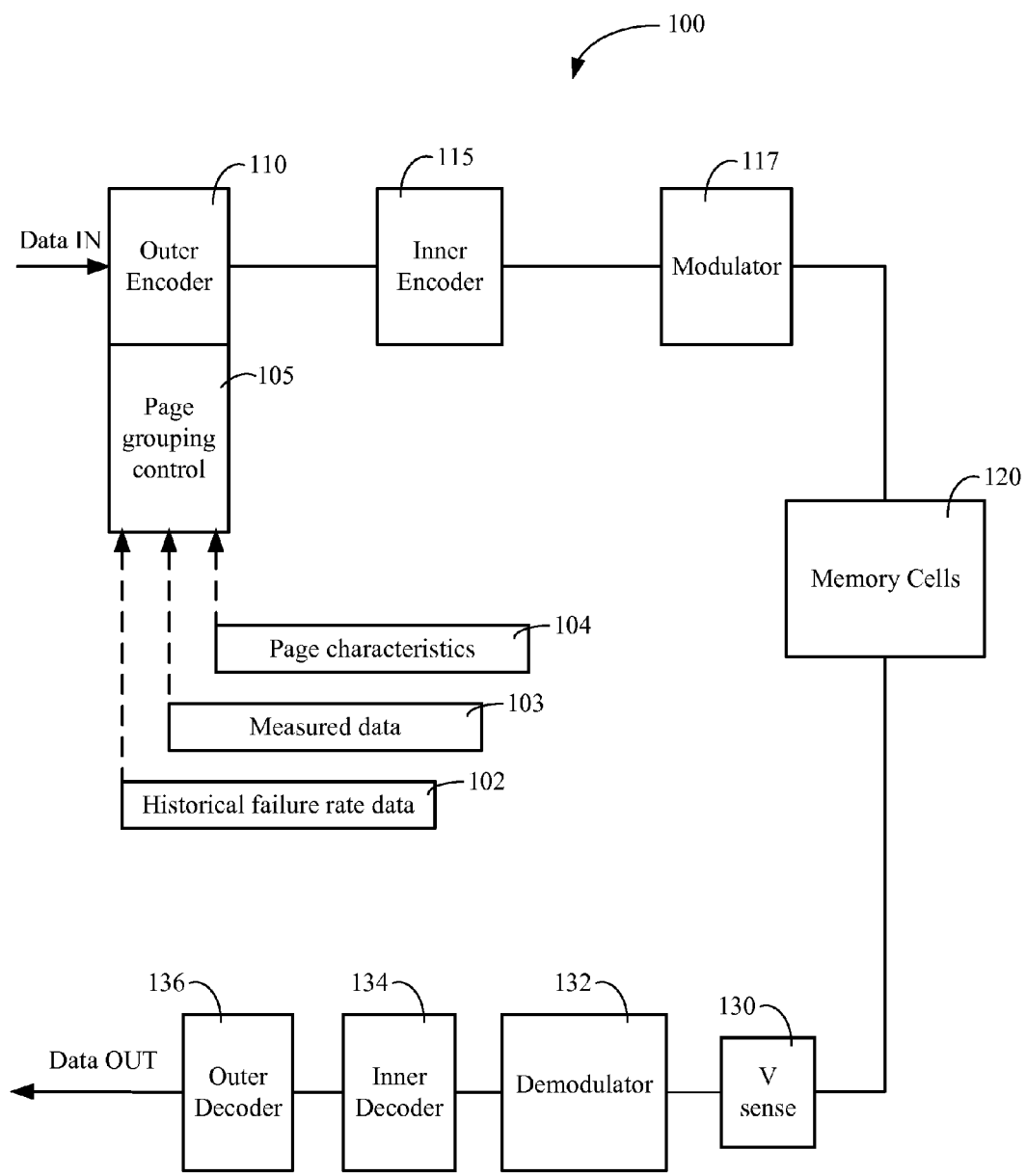
FIG. 1 is a block diagram illustrating a system configured to implement page grouping to reduce the outer code failure rate of a solid state NVM device.

FIG. 1 is a block diagram illustrating a memory device 100 configured to implement selective page grouping. The memory device 100 comprises a number of memory cells 120. In multi-level memory devices, each memory cell is able to store one or more bits of data. The memory device 100 includes page grouping control 105 that controls the grouping of pages to reduce failure rate variability of the outer code failure rates. The page group control circuitry 105 determines and keeps up with the current page groupings that are encoded by the outer codes. Grouping the pages may optionally be achieved with knowledge of page failure rate information. The page failure rate information may include, for example, the historical page failure rate data 102 and/or measured data 103, such as the distribution of measured memory cell voltages. The page failure rate information may include page characteristics 104, such as the number of erase/write cycles experienced by each page and/or the page type (MSB page or LSB page, etc.). The data is encoded according to the page groups using both an inner encoder 115 and an outer encoder 110. The outer encoder 110 encodes the data into outer code words according to the pages groups and outer parity data for the page groups. The inner encoder 115 encodes the data into inner code words and inner parity data. A modulator 117 receives the encoded data and generates signals required to store the encoded data in the cells 120 of the memory device 100.

When the stored data is accessed from the memory device, voltage sense circuitry 130 senses the voltage levels present on the cells 120 of the memory device 100. The demodulator 132 converts the stored voltage levels to an encoded binary signal. The inner decoder 134 corrects errors in the data using the inner parity data generated by the inner encoder 115. The outer decoder 136 corrects errors in the data using the outer parity data generated by the outer encoder 110.

Figure 2A:
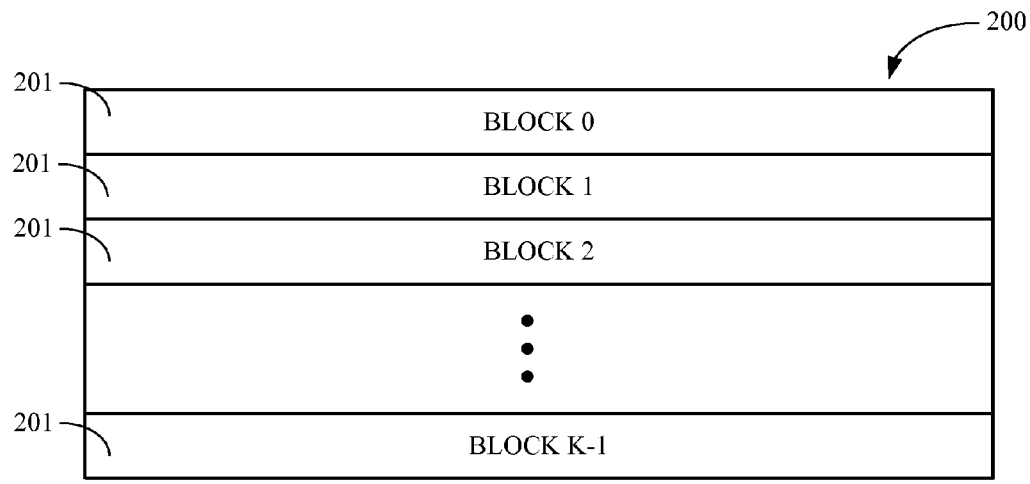
FIG. 2A illustrates a memory cell array arranged in K blocks.

A typical solid state NVM device includes an array of memory cells, each memory cell comprising a floating gate transistor. The memory cells in an array can be grouped into blocks. An exemplary block size includes 64 physical pages of memory cells with 16,384 (16K) memory cells per physical page. Other block or page sizes can be used. FIG. 2A illustrates a memory cell array 200 arranged in K blocks 201. The memory cell array in this example includes the 16K memory cells fabricated on a single semiconductor die.

Figure 2B:
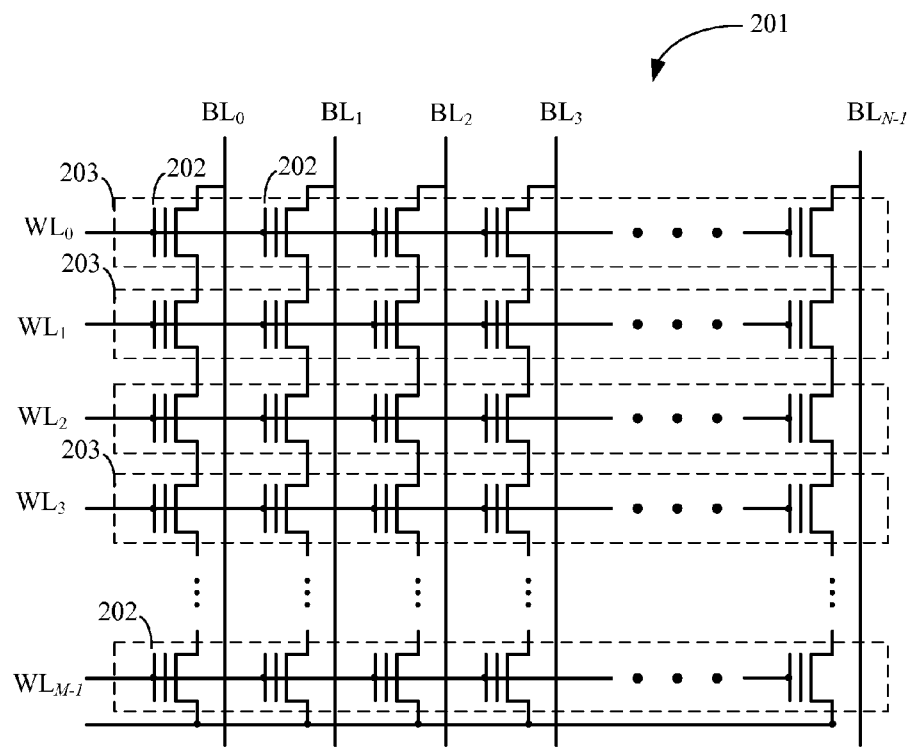
FIG. 2B illustrates the arrangement of one block of a memory cell array.

FIG. 2B illustrates one block 201 of a memory cell array. The memory cell array comprises M×N memory cells per block 201, the memory cells (floating gate transistors) 202 are arranged in M rows of physical pages 203 and in columns of N NAND strings. Each physical page 203 is associated with a word line $WL_0$-$WL_{M-1}$. When a particular word line is energized, the N memory cells of the physical page 103 associated with that particular word line are accessible on bit lines $BL_0$-$BL_{N-1}$. In alternate embodiments, the memory cells of the solid state NVM may be arranged in a NOR array or in other array types, for example.

The exemplary memory array 201 may include memory cells that are capable of storing one bit per cell, or may include memory cells capable of storing two or more bits per memory cell. In general, the ability to program memory cells to a number of voltages, q, where q can represent any of $2^c$ memory states, allows c bits to be stored in each memory cell. In multi-level memory storage devices, c is greater than or equal to 2. For example, the memory cells may be programmable to four voltage levels and thus can store two bits of information per cell.

Figure 3:
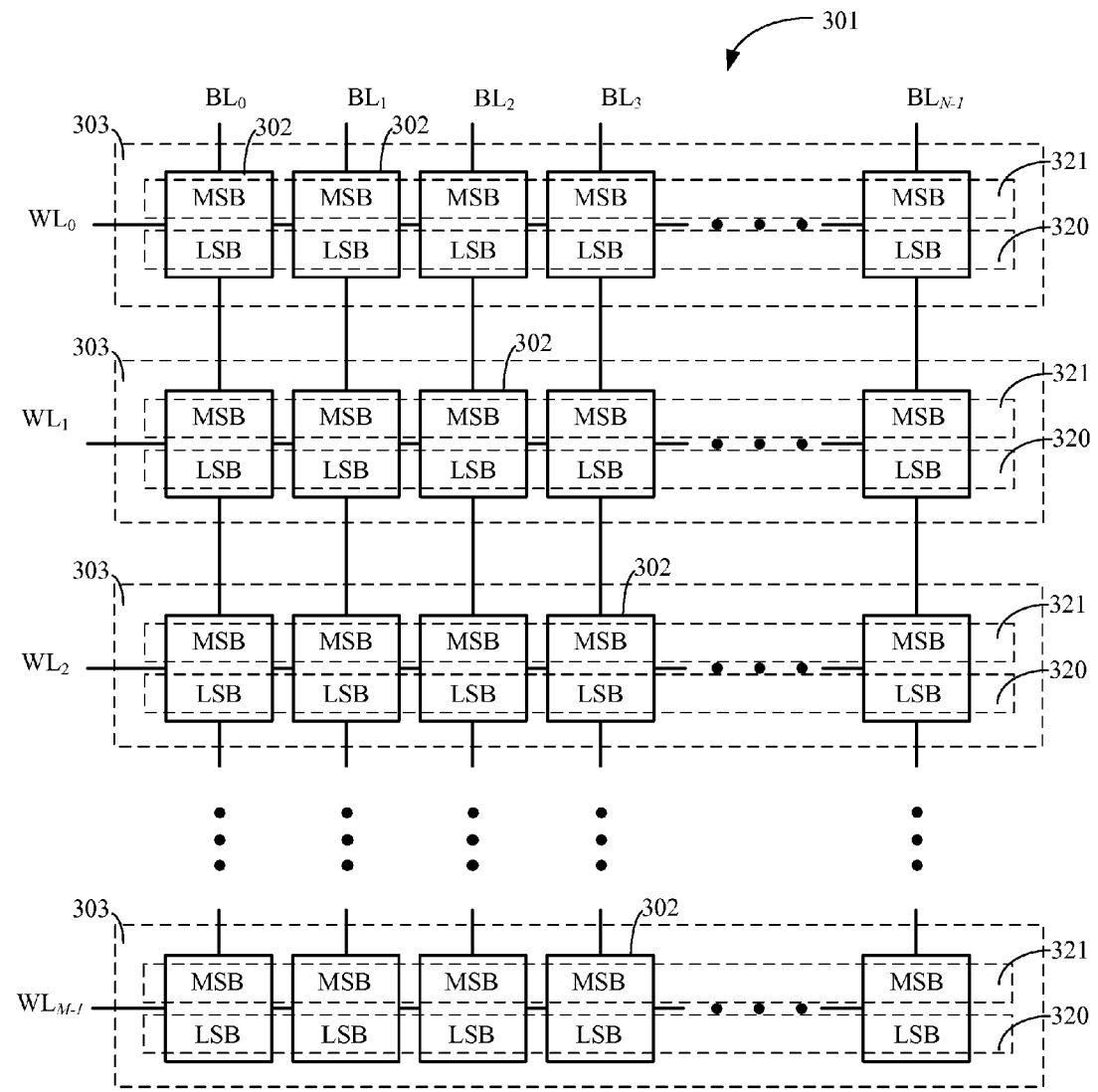
FIG. 3 illustrates the block of memory cells that are capable of storing two bits of information denoted the most significant bit (MSB) and the least significant bit (LSB)

FIG. 3 illustrates a block 301 of memory cells 302 that are capable of storing two bits of information denoted the most significant bit (MSB) and the least significant bit (LSB). Although this example involves multi-level memory cells that store two bits per memory cell, in general, multi-level memory cells may store three, four bits, five bits or even more bits per memory cell.

When multi-level memory cells are used to form the memory array, each physical page 303 associated with a word line can be subdivided into multiple logical pages 320, 321, as illustrated in FIG. 3. One logical page 320, 321 for each type of bit may be stored in the memory cells 302 of the physical page 303. Memory cell arrays that subdivide one physical page into multiple logical pages corresponding to the number of bits stored in multi-level memory cell are referred to herein as having multi-page architecture. In the exemplary memory storage array block 301 illustrated in FIG. 3, each physical page 303 associated with a word line $WL_1$-$WL_{M-1}$ is subdivided into two logical pages 320, 321. A first logical page 320 includes the LSBs of the memory cells 302 of the physical page 303. The second logical page 321 includes the MSBs of the memory cells 302 of the physical page 303. The logical pages 320, 321 associated with a physical page 303 are capable of being accessed (programmed or read) independently of each other. The LSBs stored in the memory cells of the physical page are accessed using a first logical page address and the MSBs stored in the memory cells of the physical page are accessed using a second logical page address.

In some implementations, the memory cell array can be arranged so that a word line is associated with multiple physical pages and each physical page is further subdivided into multiple logical pages according to the number of bits stored by each memory cell.

Figure 4:
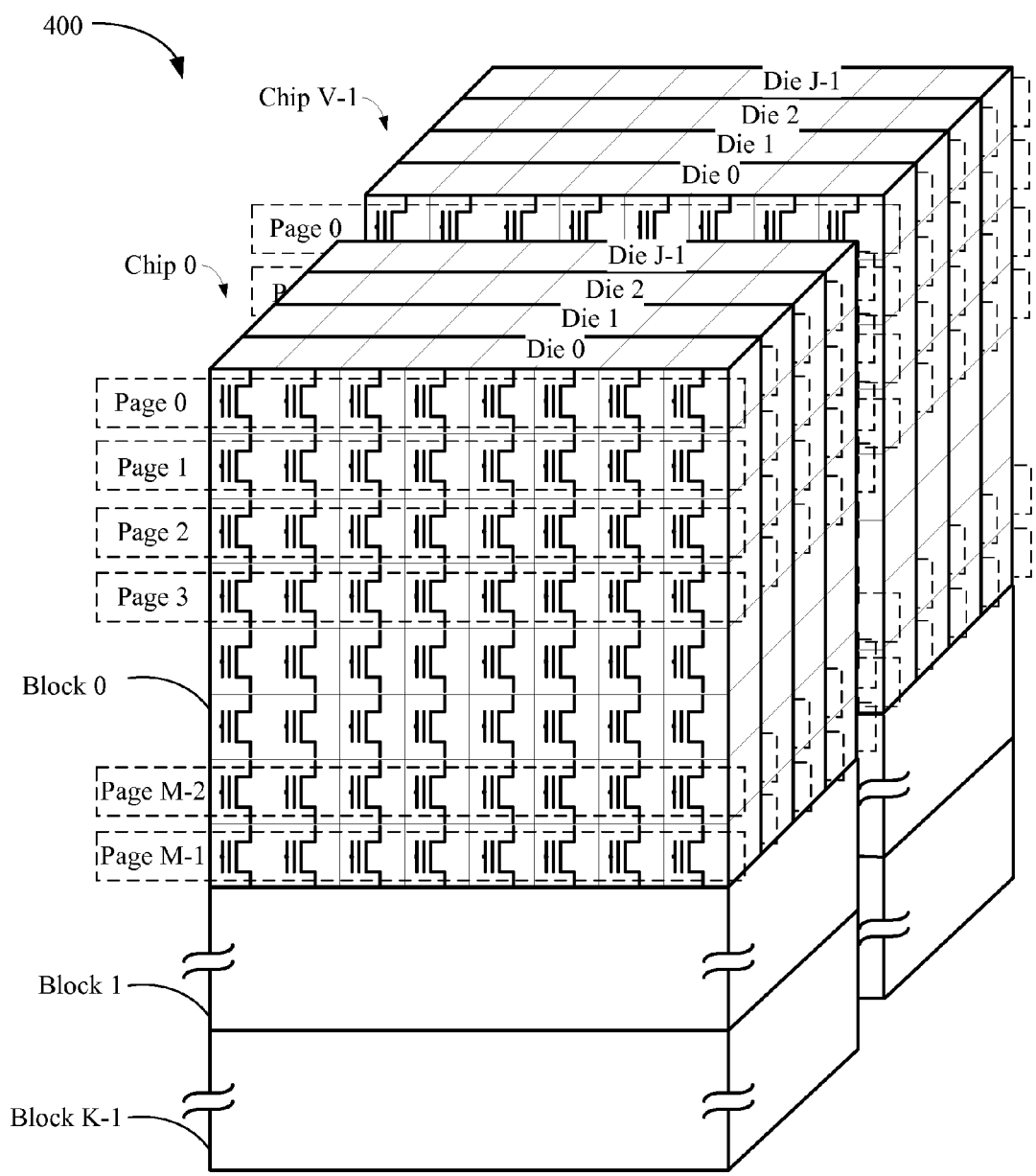
FIG. 4 illustrates a portion of a memory device that includes multiple memory chips, each memory chip comprising multiple memory die.

To increase storage capacity, some memory devices are packaged to include multiple memory chips, each memory chip having multiple memory die per memory chip, each die having multiple memory blocks per memory die. FIG. 4 illustrates a portion of a memory device 400 that includes V memory chips, depicted in FIG. 4 as Chips 0 through Chip V-1. Each memory chip includes J die, depicted in FIG. 4 as Die 0 through Die J-1. Each die includes K blocks of memory cells, depicted in FIG. 4 as Block 0 through Block K-1. Block 0 of Die 0, Chip 0 is illustrated in detail showing the multiple memory cells per block, the memory cells of each block, are arranged in M physical pages.

In some embodiments, the parity information is intermittently accumulated as the data is encoded and sequentially written into the memory device. For example, consider the process of calculating parity for two page groups. As first pages of the first page group are being written to the memory device, an intermediate parity is calculated for the first page group. The intermediate parity for the first page group is cached while first pages of the second page group are written to the memory device. As the first pages of the second page group are written to the memory device, an intermediate parity for the second page group is calculated. The intermediate parity for the second page group is cached while second pages of the first page group are written to the memory device. The intermediate parity for the first page group is retrieved from the cache and the parity calculation for the first page group resumes using the second pages of the first page group. This process of intermittently calculating the parity, caching an intermediate parity result, retrieving the intermittent parity result from the cache, and resuming calculation of the parity continues until all the pages of the page group have been encoded.

In one implementation, an entire block of data, e.g., a block of data stored in dynamic random access memory (DRAM) or other type of buffer, can be encoded in place and then sequentially transferred to the non-volatile memory, e.g., flash memory. In this implementation, an entire block (or other data unit) can be encoded without intermittently accumulating the parity, storing the intermediate parity, retrieving the intermediate parity, and resuming accumulation of the parity for each page group as previously described.

Figure 5:
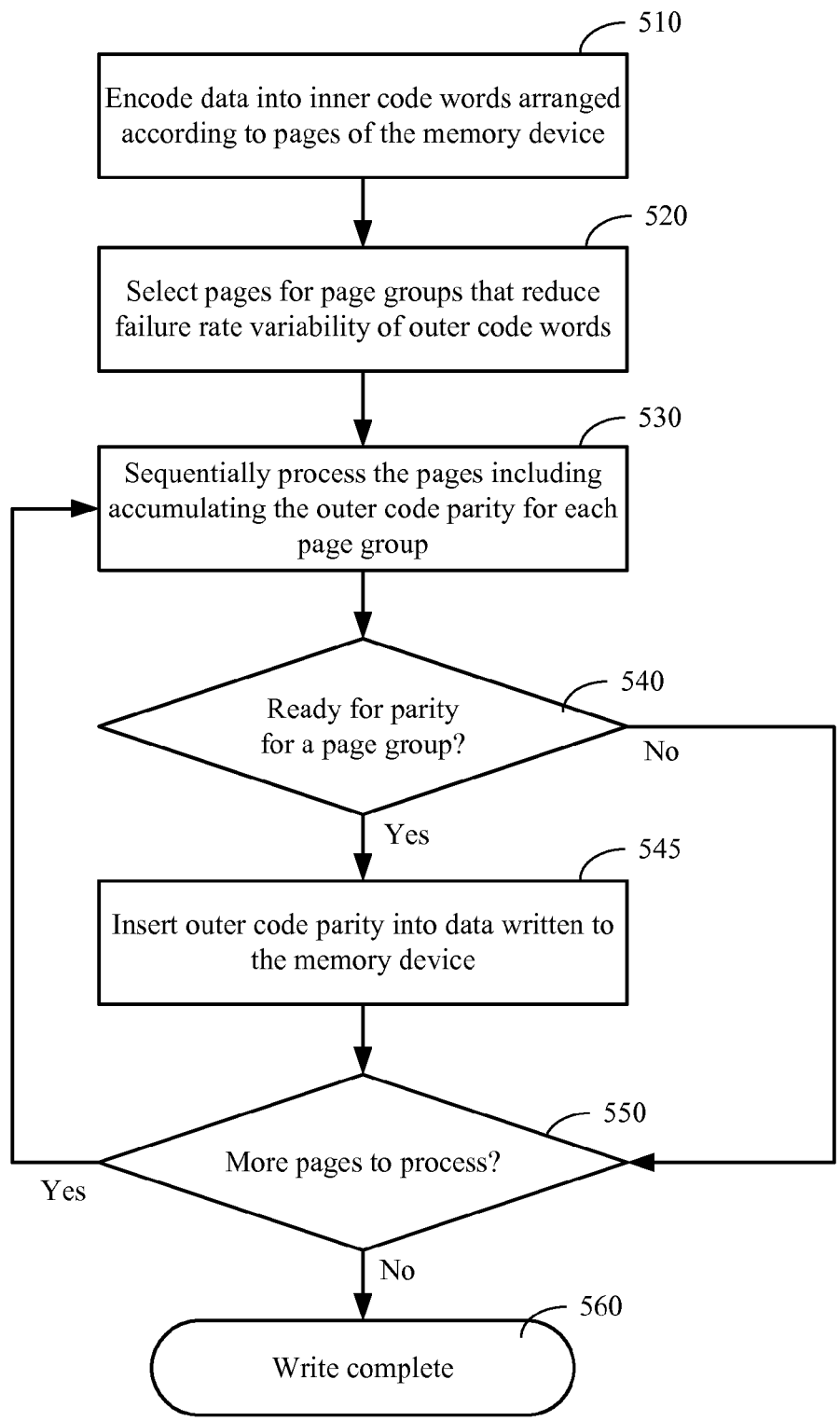
FIG. 5 is a flow diagram illustrating a process for storing data according to selectively grouped pages that are encoded by outer codes, wherein the selective grouping reduces the variability of outer code failure.

FIG. 5 is a flow diagram illustrating a process for storing data according to selectively grouped pages that are encoded by outer codes, wherein the selective grouping reduces the variability of outer code failure. In some embodiments described herein, the data elements grouped to reduce outer code failures are logical pages, although other units of data could alternatively be used.

Data to be stored in the memory device is encoded 510 into inner code words arranged according to logical pages of the memory device. The pages are selectively grouped 520 into page groups that reduce the failure rate variability of the outer code words. The pages written into the memory cells are sequentially processed 530 to generate the outer code words which include data and parity bits. As explained in more detail herein, the outer code parity for each page group is accumulated and stored while the pages of other page groups are being processed. After a page group has been processed 540, the outer code parity for that page group is inserted 545 into the output data. The incoming data continues to be processed 550, 560 until there are no more pages left to be written to the memory cells.

Figure 6:
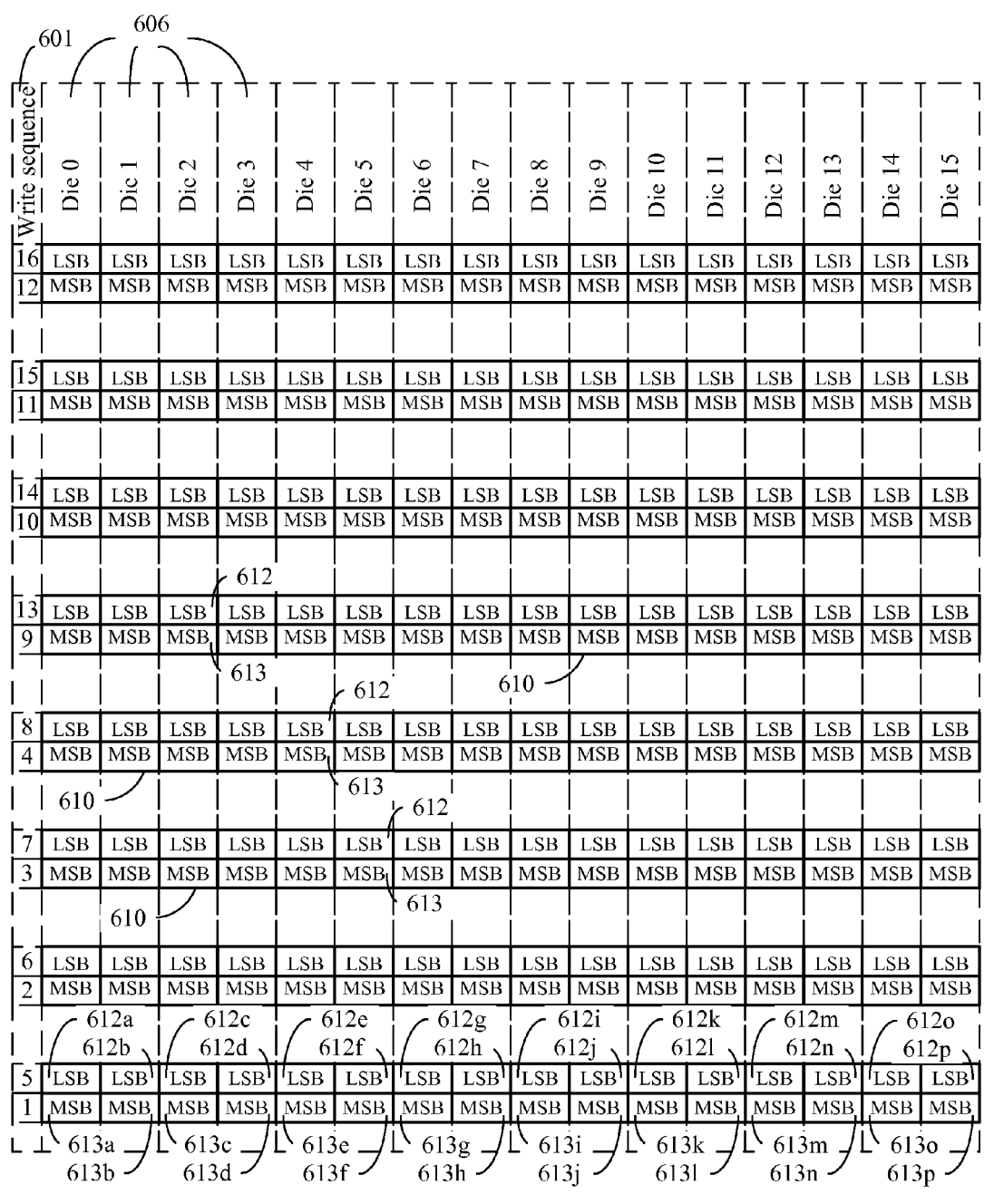

FIG. 6 illustrates a portion of a multi-level solid state NVM device including 16 die 606, 8 physical pages 610 per die 606, and an MSB page 613 and an LSB page 612 per physical page 610. During a write operation, outer codes are constructed as the new data is received and is stored in the pages from die to die along the rows horizontally. (The rows are sometimes referred to as page stripes.)

Without page grouping to achieve reduced outer code failure variability, one implementation is to cover each row by an outer code. Note that this implementation would have outer codes that covered all MSB pages in a row (see write sequence row 1) or that covered all LSB pages in a row (see write sequence row 5). Note that outer codes that cover all MSB pages would likely have a failure rate that differs from the outer codes that cover all LSB pages.

The outer code parity is generated on-the-fly as each page is written according to the write sequence 601, and the parity is written into the pages at the end of the row. For example, in FIG. 6, the bottom-most row of MSB pages 613a-613p (designated as 1 in the write sequence 601) is written first according to the write sequence 601. MSB page 613a of Die 0 is written first, followed by MSB page 613b of Die 1, followed by MSB page 613c of Die 2, and so forth. The last page written, MSB page 613p, stores the parity data for the outer code. Some outer codes may have multiple parity pages which are stored at the end of the row. Each outer code includes multiple outer code words; each outer code word includes at least one bit from each page included in the page group.

Arrangements of outer code words for solid state nonvolatile memory devices including symbol-based outer code words, are further described in U.S. Publication No. 2001/0296272 filed concurrently with this patent application, and incorporated herein by reference. The methods and devices described in U.S. Publication No. 2001/0296272 may be used in conjunction with the approaches to reduce outer code failure rate variability described herein.

In the example illustrated in FIG. 6, the LSB pages 612a-612p that are paired with MSB pages 613a-613p are written fifth in the write sequence 601. LSB pages 612a-612p are paired to MSB pages 613a-613p because each of these MSB and LSB logical pages correspond to the same physical page 610. In other words, MSB page 613a and LSB page 612a are stored in the same physical page, MSB page 613b and LSB page 612b are stored in the same physical page, and so forth. The LSB pages 612a-612p are written sequentially along the row, with LSB page 612a written first, LSB page 612b written second, LSB page 612c written third, and so forth. As the LSB pages 612a-612o are being written, the outer code parity for the pages is generated on-the-fly. The last page written, LSB page 612*p*, stores the parity for the row.

The write sequence 601 for the memory device is indicated by the numbers in left most column of FIG. 6. Note that the write sequence row 1 of MSB pages at the bottom of FIG. 6 are the first pages written, followed by three more rows of MSB pages which are designated rows 2, 3, and 4 in the write sequence 601. The bottom-most LSB pages 612*a*-612*p* in FIG. 6 (write sequence row 5) are paired with the first written MSB pages 613*a*-613*p* (write sequence row 1). The LSB pages 612*a*-612*p* are written after the MSB pages in rows 2, 3, and 4 are written. In other words, there is a gap of three rows between the time that a row of MSB pages is written and the time that the row of LSB pages that are paired with the pages of the MSB row is written. This timing gap presents some challenges when the pages are selectively grouped to reduce the variability in the outer code failure rates as further described herein. Note that although the examples provided herein involve outer codes that span multiple die, the outer codes would be arranged to span other units of data, e.g., data blocks or chips. An outer code "spans" multiple die when at least one bit from each of the multiple pages is included in the outer code words of the outer code.

Figure 7A:
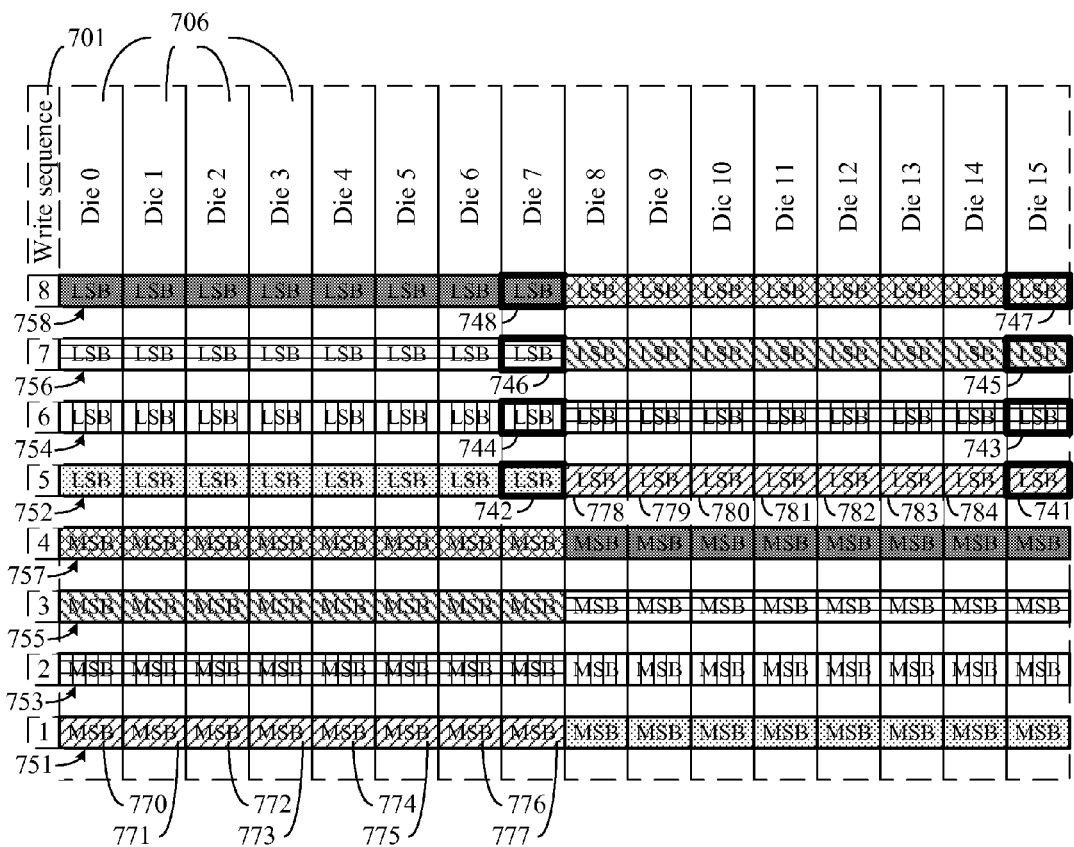
FIG. 7A illustrates grouping logical pages based on page type to reduce the variability of the outer code failure rate.

FIG. 7A illustrates an approach involving grouping logical pages based on page type to reduce the variability of the outer code failure rate. FIG. 7A illustrates a portion of a multi-level memory device having 16 die 706. In this example, it is predicted that the LSB pages and the MSB pages will have different error rates. An equal or roughly equal number of LSB pages and MSB pages are grouped into page groups and the page groups are encoded by the outer codes. In this example, 8 outer codes encode 8 page groups 751-758. Each of the age groups 751-758 is represented by a different shading in FIG. 7. Note that each outer code comprises multiple outer code words and each of the outer code words span the pages of the die in the page groups 751-758. A code word "spans" multiple pages when at least one bit from each of the multiple pages is included in the code word.

Paired MSB and LSB pages may not be written sequentially. The rows are illustrated in order of their write sequence from the bottom of the page towards the top of the page in FIG. 7A. Contrast the depiction of FIG. 7A with that of FIG. 6 in which the rows are arranged with paired pages appearing together. In FIG. 7A, the MSB pages of write sequence row 1 are paired with the LSB pages of write sequence row 5; the MSB pages of write sequence row 2 are paired with the LSB pages of write sequence row 6; the MSB pages write sequence row 3 are paired with the LSB pages of write sequence row 7; the MSB pages of write sequence row 4 are paired with the LSB pages of write sequence row 8. Paired pages are logical pages stored in the same physical page of a multi-level memory device.

The page groups 751-758 illustrated in FIG. 7A each include equal numbers of MSB and LSB pages to reduce the failure rate variability of the outer codes that encode the page groups 751-758. Each page group 751-758 includes 8 MSB pages and 8 LSB pages, with LSB pages 741-748 storing the parity for the page groups 751-758. As illustrated in FIG. 7, the pages of the page groups 751-758 are interleaved. For example, one page group 751 includes 8 MSB pages from write sequence row 1 and 8 LSB pages from write sequence row 5; another page group 752 includes 8 MSB pages from write sequence row 1 and 8 LSB pages from write sequence row 5, and so forth. The MSB pages of the page groups 751-758 are written sequentially and the LSB pages of the page groups are written sequentially. However, for each page group 751-758 there is a gap between the time the MSB pages of the page group are written and the time that the paired LSB pages of the page group are written.

FIG. 7B illustrates the outer code arrangement including multiple outer words that cover page group 751. In this example, parity for the outer code words is calculated by exclusive ORing each bit in an outer code word column. The last page 741 stores the XORed parity for the columns. Each of the outer code words spans the 16 die. Parity bit OP0 is the XOR of all of the b0s for the pages 770 through 784; parity bit OP1 is the XOR of all the b1s for the pages 770 through 784; OP2 is the XOR of all the b2s for the pages 770 through 784, and so forth. Although this example illustrates the outer code words as comprising a single bit from each page, in other implementations, the outer code words may be symbol-based, comprising multiple bit symbols from each page.

Figure 8A:
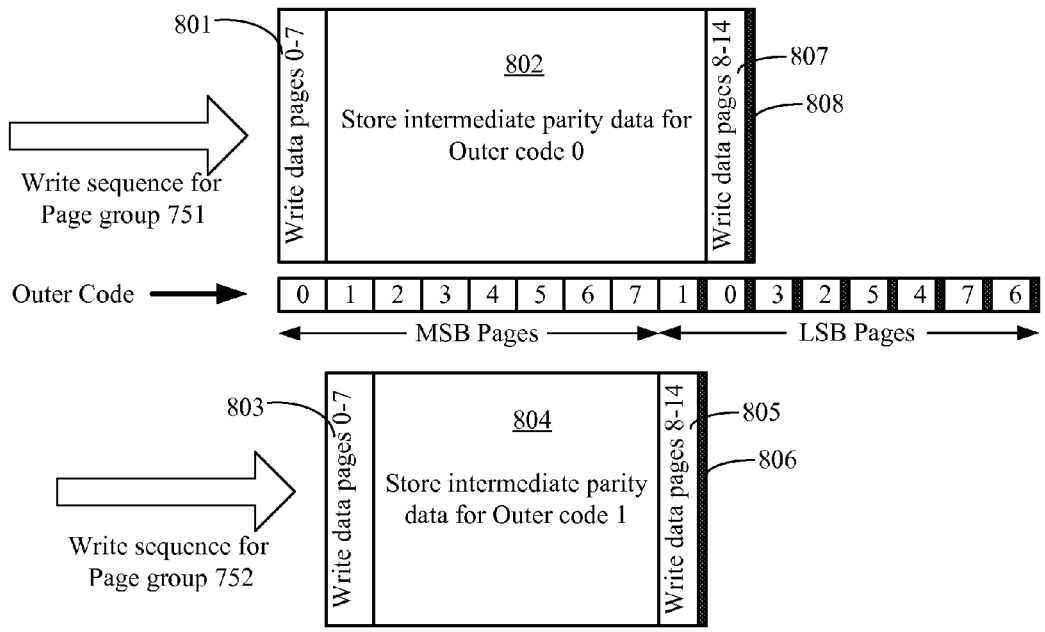
FIGS. 8A and 8B show the write sequence for page groups.
Figure 8B:
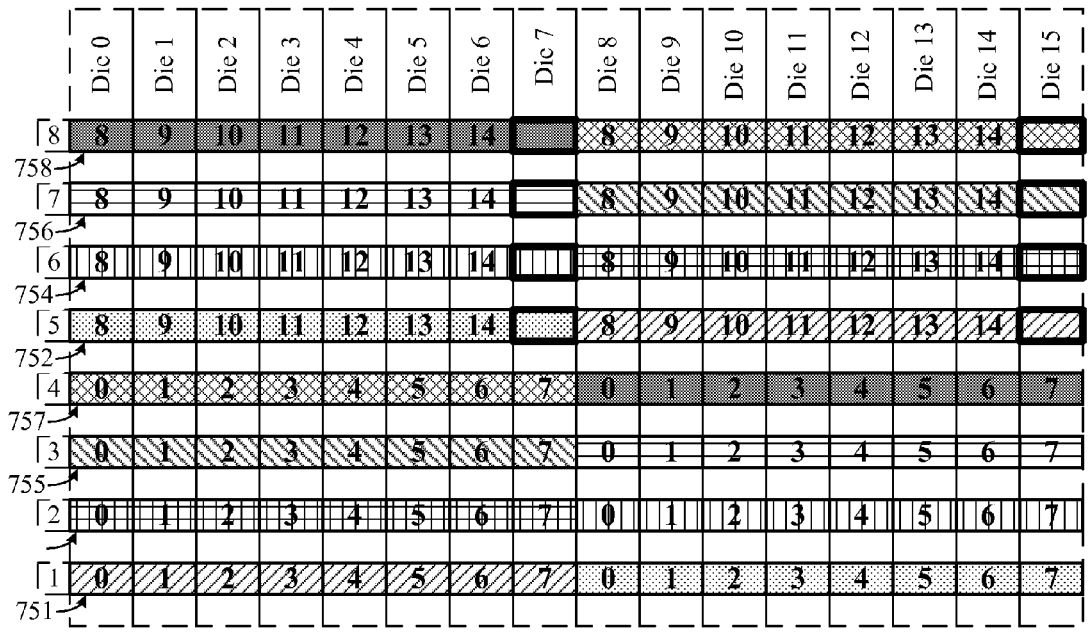

FIGS. 8A and 8B illustrate the write sequence for the page groups 751-758 illustrated in FIG. 7A. As depicted in FIG. 8B each of the page groups 751-758 include 8 MSB pages (Pages 0 through 7) and 8 LSB pages (Pages 8 through 15). For each page group, the last LSB page (Page 15) is the parity page for the outer code.

With reference to FIGS. 8A and 8B, the write sequences for page groups 751 and 752 are illustrated in more detail. Page group 751 is encoded by outer code 0; page group 752 is encoded by outer code 1; page group 753 is encoded by outer code 2; page group 754 is encoded by outer code 3, page group 755 is encoded by outer code 4; page group 756 is encoded by outer code 5; page group 757 is encoded by outer code 6; and page group 758 is encoded by outer code 7.

As the MSB pages 0 through 7 of page group 751 are sequentially processed, e.g., written 801 into the memory device, an intermediate outer code parity page group 751, designated outer code 0, is accumulated 802. In other words, an intermediate outer code parity for each of the outer code words of outer code 0 are accumulated, see FIG. 7B). As MSB pages 0 through 7 of page group 752 are sequentially 803 written, the intermediate outer code parity for page group 752, designated outer code 1, is accumulated 804. The intermediate parity data for page group 751 (outer code 0) is temporarily stored as the MSB pages of page group 752, (outer code 1), MSB pages of page group 753 (outer code 2), MSB pages of page group 754 (outer code 3), MSB pages of page group 755 (outer code 4), MSB pages of page group 756 (outer code 5), MSB pages of page group 757 (outer code 6), and MSB pages of page group 758 (outer code 7) are written to the memory device. The intermediate parity data for page group 751 (outer code 0) continues to be temporarily stored while the LSB pages 8 through 14 of page group 752 (outer code 1) are written 805, which also includes writing 806 the parity page for page group 752 (outer code 1).

After this interruption, the writing of page group 751 is resumed as LSB pages 8 through 14 of page group 751 (outer code 0) are written 807. Accumulation of the parity for page group 751 resumes. After page 14 of page group 751 (outer code 0) is written, then the parity page (page 15) for page group 751 is written 808 to the memory device.

Grouping pages based on page type (MSB or LSB page type) is one approach for selectively grouping pages encoded by outer codes to achieve a reduction in the variability of the failure rate of the outer codes. Other approaches for selectively grouping pages are also possible. In some implementations, the selective grouping is a randomized grouping of pages. Randomization of the pages within the page groups for the outer code provides an reduction in the variability in the failure rates of the outer codes based on the statistical probability that each page group will have a substantially similar distribution of page failure rates. Randomization of the pages within the page groups to reduce variability of the outer code failures may be particularly useful in memory devices that do have the capability to determine the actual page failure rates and/or to predict the page failure rates, for example.

In some implementations, the historical failure rates of the pages are known, and the selective grouping of the pages is achieved with knowledge of the historical page failure rates. The failure rate of each page may be determined for each of a number of write cycles and may be tracked over time. The pages may be dynamically grouped based on the historical failure rate data and/or may be dynamically grouped based on trends developed from the historical failure rates of the pages, for example, the rates of change of the page failure rates.

As an example, consider a situation in which each page has a historical failure rate above or below a threshold. Pages with failure rates above the threshold are considered to have a failure rate of A (denoted "A pages"). Pages with failure rates below the threshold are considered to have a failure rate of B (denoted "B pages"). Selectively grouping the pages to reduce variability in outer code failure may involve grouping the A and B pages so that each page group has roughly equivalent numbers of A pages and B pages.

In some implementations the failure rates of the pages may be predicted based on measured data or on other information. In some scenarios, a voltage distribution for a page may be determined based on the sensed voltages of the memory cells that make up the page. The voltage distributions of the pages (or tracked changes, e.g., rates of change, in the voltages distributions of the pages) may be used to predict the failure rate of the pages. The pages may be grouped according to the predicted failure rates.

In some implementations, the failure rates of the pages may be predicted based on use factors, e.g., the number of erase/write cycles experienced by the pages. In yet another example, the failure rates of the pages may be predicted based on the type of page. To reduce the variability in outer code failure, the pages may be grouped according to use factors and/or page type. For example, for multi-page architecture devices, the LSB pages may have a different failure rate than the MSB pages. Some implementations involve grouping an equal or roughly equal number of MSB pages and LSB pages in each page group encoded by an outer code. As previously discussed, page groups may be determined statically (one grouping for each write cycle) or may be dynamically grouped, e.g., based on the use factors or measured values. In some scenarios, the pages may be dynamically grouped based on rates of change of the measured values.

Figure 9A:
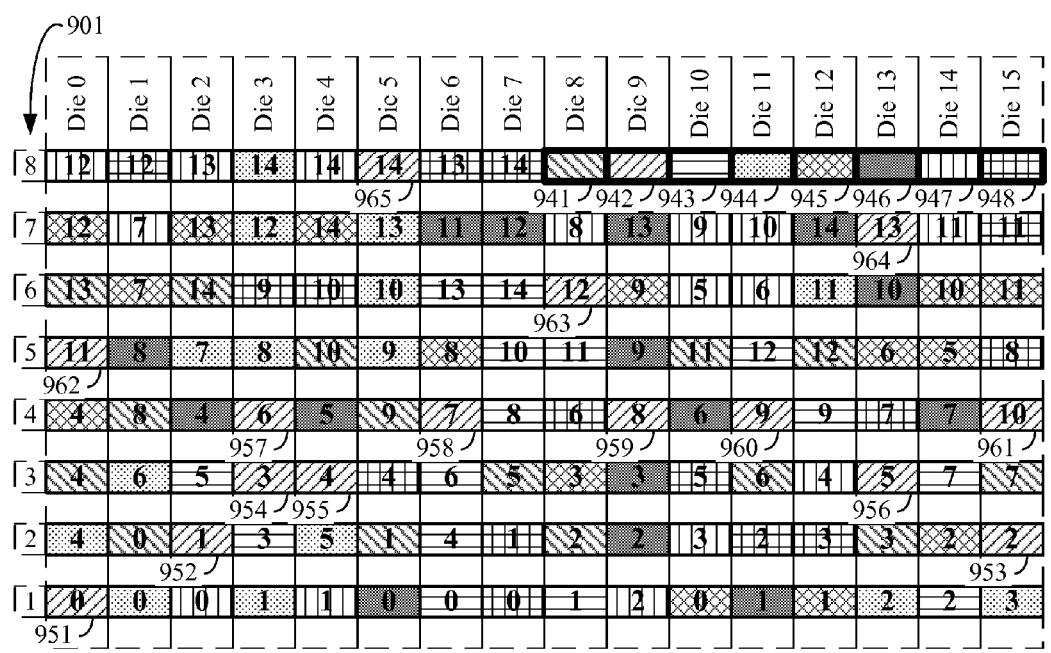
FIG. 9A illustrates grouping of pages according to a random selection.

FIG. 9A illustrates grouping of pages based on random selection. As before, there are 8 page groups of 16 pages each. The pages are randomly assigned to the 8 page groups. The pages are written sequentially according to the write sequence 901 and the intermediate parity for each page group is accumulated until the parity page 941-948 for each page group is written. In this example, the parity pages 941-948 are written last. As before, FIG. 9A illustrates each page group represented by a distinctive shading.

The page group encoded by outer code 0 is used as an example. As illustrated in FIG. 9A, this group includes 15 data pages 951-965 and one parity page 942. The 15 data pages 951-965 include 10 MSB pages 951-960 and 5 LSB pages 961-965. Random selection of pages for the pages groups reduces variability in outer code failure due to the statistical probability that the page failure rate distribution of each page group will be substantially similar.

Figure 9B:
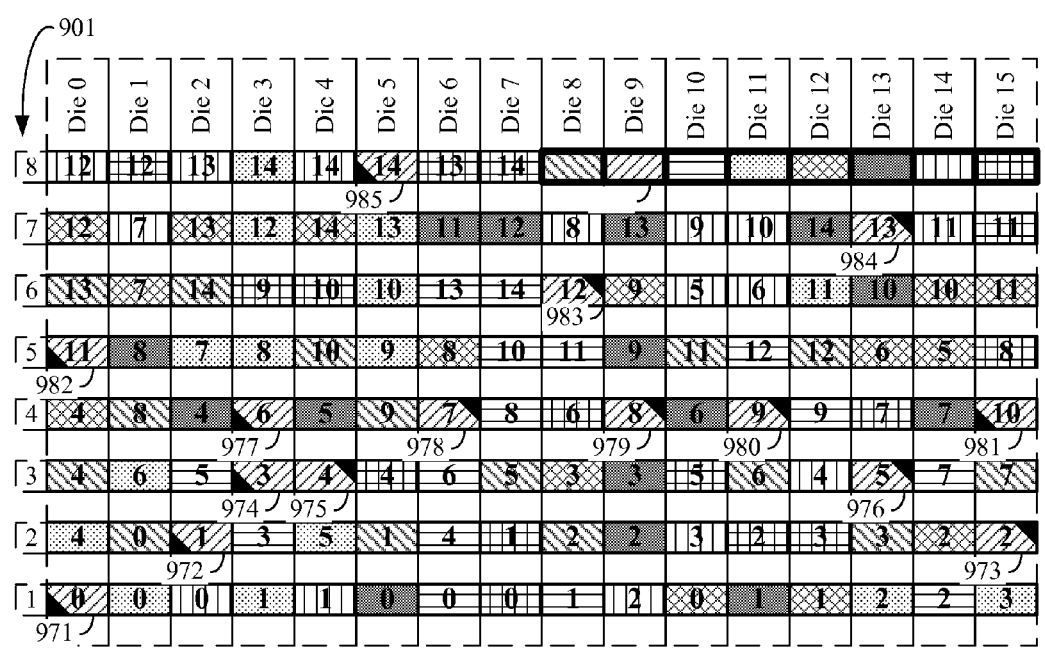
FIG. 9B illustrates selective grouping of pages according to failure rate.

In some implementations, the pages may be grouped according to known or predicted failure rates to achieve approximately equal outer code failure rates. As an example, consider pages that fall into two failure rate categories. Pages having a failure rate greater than a threshold are considered to fall in a first failure rate category (Category A) and pages having a failure rate less than or equal to the threshold are considered to fall into a second failure rate category (Category B). The pages are selectively grouped to include an equal or about equal number of Category A pages and Category B pages. FIG. 9B illustrates selective grouping of pages according to failure rate. The memory device depicted in FIG. 9B includes 16 die with 8 page groups having 16 pages in each group. Category A pages are denoted by a triangle in the lower left of the page symbol and category B pages are denoted by a triangle in the upper right of the page symbol. The page group encoded as outer code 0 is used as an example. As illustrated in FIG. 9B, this group includes 15 data pages 971-985 and one parity page 986. The 15 data pages 971-985 include an about equal number of Category A pages and Category B pages, i.e., the page group includes 7 Category A pages 971, 972, 974, 977, 981, 982, 985 and 8 Category B pages 973, 975, 976, 978, 979, 980, 983, 984.

Figure 10:
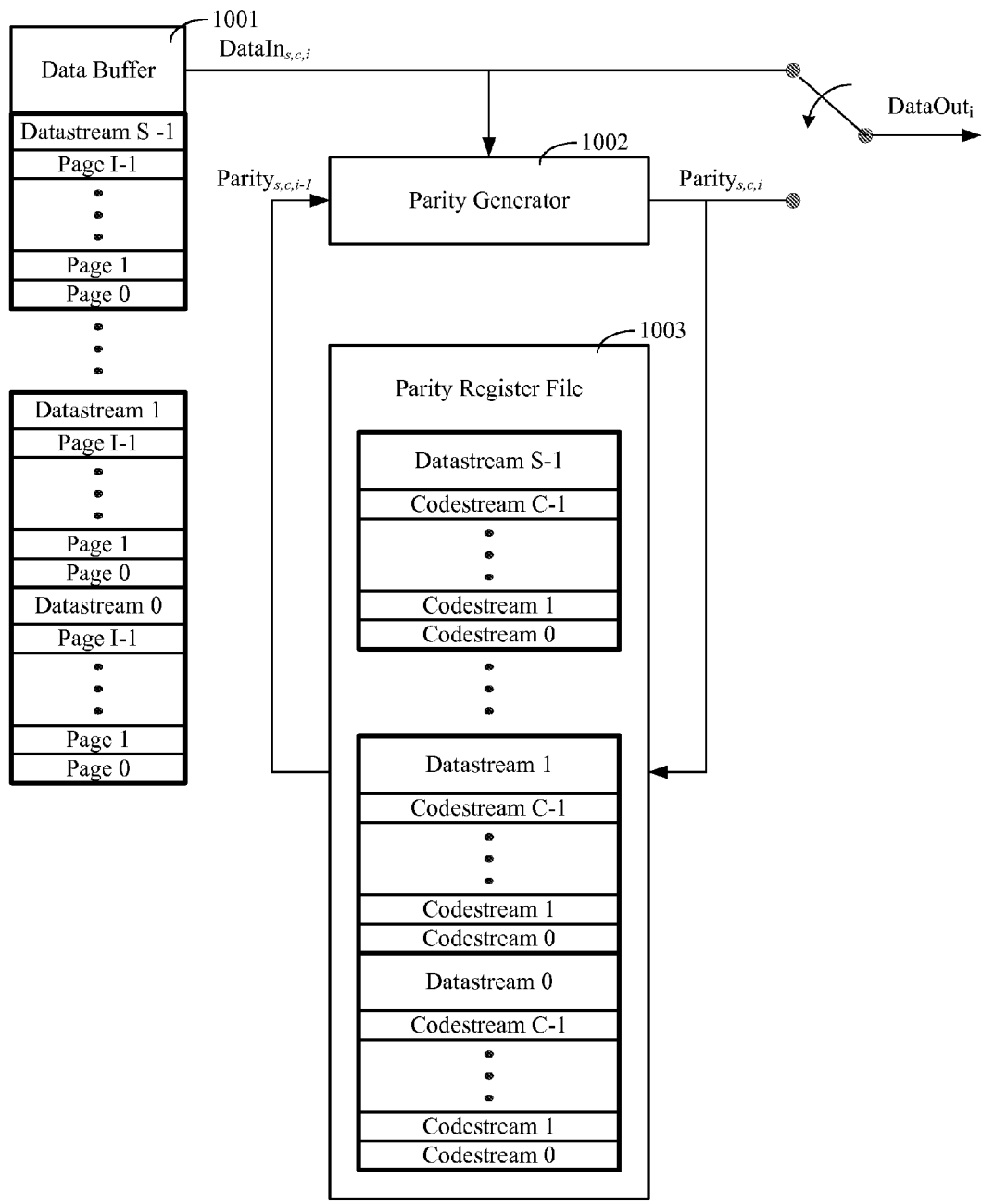
FIG. 10 illustrates components and operation of the outer encoder circuitry.

FIG. 10 illustrates components and operation of the outer encoder circuitry in more detail. Each page group is represented by a sequential data stream, and in FIG. 10, S data streams (data streams 0 through S-1) are illustrated. Each data stream includes I pages (pages 0 through I-1). Outer code streams are generated from the pages of the page groups. FIG. 10 illustrates C code streams (code streams 0 through C-1) for each data stream. $DataIn_{s,c,i}$ represents the sequential data from the data buffer 1001 which is output to the memory cells and input to the parity generator 1002, where i indexes the data units (pages) aggregated in the page group covered by an outer code, s indexes the page groups as data streams, and c indexes the outer code words generated from the pages of the page groups.

As the first I-2 pages of data for each data stream are written, parity for C code words is accumulated by the parity generator 1002 as C code streams. As the pages are sequentially written, parity accumulated from the previous page is combined with the page data that is currently being written to update the intermediate parity. The intermediate parity is stored in the parity register file 1003 until needed. The DataOut path is multiplexed between the input data streams and the appropriate parity. After each page group is sequentially written, the outer code parity is sourced from the parity generator 1002 and is output to the memory cells.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A device, comprising:
    an inner encoder configured to encode data into inner code words corresponding to pages of a solid state memory device that are sequentially accessed;
    a page grouping circuit configured to select pages for page groups to achieve approximately equal outer code failure rates for the page groups, each outer code including outer code parity;
    an outer encoder configured to encode the page groups into the outer codes and store the encoded page groups in the memory device, wherein encoding the page groups and storing the encoded page groups includes intermittently accumulating the outer code parity for each of the page groups as the pages are sequentially stored in the memory device.

2. The device of claim 1, wherein selecting the pages for page groups comprises selecting the pages based on one of measured or predicted failure rates of the pages.

3. The device of claim 2, wherein selecting the pages for the page groups further comprises:
forming a first group of pages having the measured or predicted failure rates of the pages above a threshold;
forming a second group of the pages having the measured or predicted failure rates of the pages below the threshold; and
selecting an equal number of pages from the first and second group to form the page groups.

4. The device of claim 1, wherein selecting the pages for the page groups comprises randomly selecting the pages.

5. The device of claim 1, wherein storing the page groups comprises interleaving pages of a first page group encoded using a first outer code with pages of a second page group encoded using a second outer code.

6. The device of claim 1, wherein the solid state memory device comprises multi-level memory cells.

7. The device of claim 1, further comprising the solid state memory device coupled to the outer encoder.

8. A method comprising:
encoding data into inner code words corresponding to pages of a solid state memory device that are sequentially accessed;
selecting pages for page groups to achieve approximately equal outer code failure rates for the page groups, each outer code including outer code parity;
an outer encoder configured to encode the page groups into the outer codes and store the encoded page groups in the memory device, wherein encoding the page groups and storing the encoded page groups includes intermittently accumulating the outer code parity for each of the page groups as the pages are sequentially stored in the memory device.

9. The method of claim 8, wherein selecting the pages for page groups comprises selecting the pages based on one of measured or predicted failure rates of the pages.

10. The method of claim 9, wherein selecting the pages for the page groups further comprises:
forming a first group of pages having the measured or predicted failure rates of the pages above a threshold;
forming a second group of the pages having the measured or predicted failure rates of the pages below the threshold; and
selecting an equal number of pages from the first and second group to form the page groups.

11. The method of claim 8, wherein selecting the pages for the page groups comprises randomly selecting the pages.

12. The method of claim 8, wherein storing the page groups comprises interleaving pages of a first page group encoded using a first outer code with pages of a second page group encoded using a second outer code.

13. The method of claim 8, wherein the solid state memory device comprises multi-level memory cells.

14. A device comprising:
an inner encoder configured to encode data into inner code words, the inner code words arranged according to MSB pages of a solid state non-volatile memory device having multi-level memory cells, the MSB pages comprising most significant bits (MSBs) of the memory cells and LSB pages comprising least significant bits (LSBs) of the memory cells, the MSB and LSB pages sequentially accessed in a particular order;
and outer encoder encoding page groups of MSB pages and LSB pages into outer codes, each page group having a substantially equal number of MSB pages and LSB pages; and
storing the encoded page groups in the memory device, wherein encoding the page groups and storing the encoded page groups includes intermittently accumulating the outer code parity for each of the page groups as the pages are sequentially stored in the memory device according to the particular order.

15. The device of claim 14, wherein encoding the MSB and LSB pages into the outer codes comprises encoding paired MSB and LSB pages into the outer code words, each of the paired MSB and LSB pages stored together in the same physical page of the memory cells.

16. The device of claim 15, further comprising a page grouping circuit configured to select paired MSB pages and LSB pages for the page groups to achieve approximately equal outer code failure rates for the page groups.

17. The device of claim 16, wherein selecting the pages for page groups comprises selecting the pages based on one of measured or predicted failure rates of the pages.

18. The device of claim 17, wherein selecting the pages for the page groups further comprises:
forming a first group of pages having the measured or predicted failure rates of the pages above a threshold;
forming a second group of the pages having the measured or predicted failure rates of the pages below the threshold; and
selecting an equal number of pages from the first and second group to form the page groups.

19. The device of claim 16, wherein selecting the pages for the page groups comprises randomly selecting the pages.

20. The method of claim 14, wherein storing the page groups comprises interleaving pages of a first page group encoded using a first outer code with pages of a second page group encoded using a second outer code.

* * * * *